United States Patent
Joshi et al.

(10) Patent No.: US 6,902,960 B2
(45) Date of Patent: *Jun. 7, 2005

(54) OXIDE INTERFACE AND A METHOD FOR FABRICATING OXIDE THIN FILMS

(75) Inventors: Pooran Chandra Joshi, Vancouver, WA (US); John W. Hartzell, Camas, WA (US); Masahiro Adachi, Vancouver, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/295,400

(22) Filed: Nov. 14, 2002

(65) Prior Publication Data

US 2004/0094808 A1 May 20, 2004

(51) Int. Cl.⁷ .......................... H01L 21/00; H01L 21/84
(52) U.S. Cl. .................. 438/149; 438/152; 438/165
(58) Field of Search .......................... 438/149, 152, 438/153, 165, 769, 770

(56) References Cited

U.S. PATENT DOCUMENTS

| | | | |
|---|---|---|---|
| 5,681,418 A | 10/1997 | Ishimaru ................ 156/345 |
| 5,792,522 A | 8/1998 | Jin et al. ................ 427/575 |
| 6,037,278 A * | 3/2000 | Koyanagi et al. ........... 438/787 |
| 6,040,022 A | 3/2000 | Chang et al. ................ 427/579 |
| 6,057,210 A * | 5/2000 | Yang et al. ................ 438/427 |
| 6,096,661 A | 8/2000 | Ngo et al. ................ 438/788 |
| 6,159,559 A | 12/2000 | Reber et al. ................ 427/579 |
| 6,326,309 B2 * | 12/2001 | Hatanaka et al. ........... 438/693 |
| 6,551,946 B1 * | 4/2003 | Chen et al. ................ 438/770 |
| 6,646,287 B1 * | 11/2003 | Ono et al. ................ 257/66 |
| 6,677,646 B2 * | 1/2004 | Ieong et al. ................ 257/347 |
| 6,689,646 B1 * | 2/2004 | Joshi et al. ................ 438/149 |
| 2002/0168869 A1 * | 11/2002 | Chang et al. ................ 438/769 |

* cited by examiner

Primary Examiner—Phat X. Cao
Assistant Examiner—Theresa T. Doan
(74) Attorney, Agent, or Firm—David C. Ripma; Matthew D. Rabdau; Joseph P. Curtin

(57) ABSTRACT

An oxide interface and a method for fabricating an oxide interface are provided. The method comprises forming a silicon layer and an oxide layer overlying the silicon layer. The oxide layer is formed at a temperature of less than 400° C. using an inductively coupled plasma source. In some aspects of the method, the oxide layer is more than 20 nanometers (nm) thick and has a refractive index between 1.45 and 1.47. In some aspects of the method, the oxide layer is formed by plasma oxidizing the silicon layer, producing plasma oxide at a rate of up to approximately 4.4 nm per minute (after one minute). In some aspects of the method, a high-density plasma enhanced chemical vapor deposition (HD-PECVD) process is used to form the oxide layer. In some aspects of the method, the silicon and oxide layers are incorporated into a thin film transistor.

28 Claims, 6 Drawing Sheets

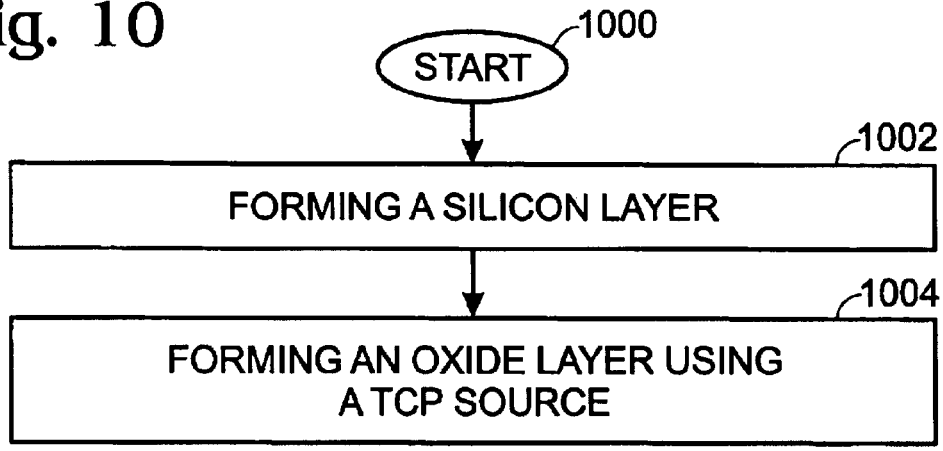
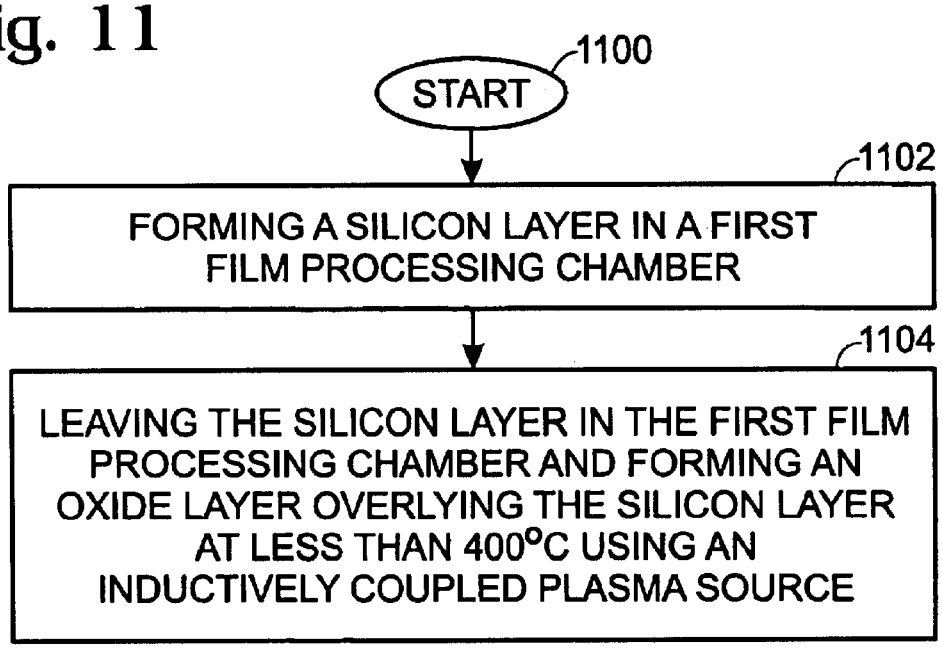

OXIDE INTERFACE AND A METHOD FOR FABRICATING OXIDE THIN FILMS

BACKGROUND OF THE INVENTION

1. Field of the Invention

This invention generally relates to the fabrication of integrated circuit (IC) devices, and more particularly, to an oxide interface on silicon and a method for forming the same using high-density plasma.

2. Description of the Related Art

FIG. 1 is a schematic of a stacked gate structure for a thin film transistor (prior art). The proper performance of IC devices depends, in part, on the characteristics of oxide layers within the device structure. A thin film transistor (TFT) will be used as an illustration, however, it is understood that the discussion applies to other IC devices as well. In FIG. 1, oxide layers form the gate insulator. Both the bulk characteristics of the gate insulator and the characteristics of the interface between the gate insulator and the silicon layer are very important for the operation of a TFT. For silicon devices, a good gate insulator film is silicon dioxide ($SiO_2$), and a good method of forming a high quality $SiO_2$ film with excellent bulk and interface characteristics is by thermal oxidation. For a TFT, thermal oxidation involves forming a layer of silicon over a diffusion barrier and substrate and heating the resulting stack structure to form a layer of $SiO_2$ overlying the silicon layer. To produce an oxide layer at growth rates rapid enough to be economically practical, thermal oxidation typically is performed at temperatures between 800° C. and 1200° C. Only a limited number of substrate materials, for example, silicon, are compatible with the temperatures required for thermal oxidation.

FIG. 2 is a schematic drawing of a plasma enhanced chemical vapor deposition (PECVD) system (prior art). The use of substrate materials incompatible with the temperatures associated with thermal oxidation is of increasing interest. For example, improvements in liquid crystal display (LCD) technology create a need for high performance TFT driver components on transparent substrates such as glass and polymer. Unfortunately, the transparent substrates noted above are incompatible with the temperatures required for thermal oxidation. In fact, it is desirable to process these substrates at temperatures below 400° C. (hereafter referred to as low temperature). Unfortunately, the use of PECVD at low temperature results in higher impurity levels for oxide layers than are typical for thermal oxide or PECVD oxide formed at temperatures greater than 400° C. In addition, low temperature PECVD results in lower oxide deposition rates than are associated with PECVD at temperatures greater than 400° C. For typical low temperature PECVD oxide layers, characteristics such as refractive index, fixed oxide charge density, breakdown field strength, leakage current density, and interface trap density are all inferior to those for typical thermal oxide layers. For example, thermal oxide has a refractive index of 1.46, while low temperature PECVD oxide has a refractive index of less than 1.45. Modifying low temperature PECVD process parameters to increase deposition rates reduces the quality of the bulk and interface characteristics for the resulting oxide. The process in FIG. 2 uses capacitively coupled plasma. The high frequency power is directly connected to the top electrode and capacitively coupled to the bottom electrode. The two electrodes are therefore coupled, and it is not possible to independently control energy directed to the top and bottom electrodes. Therefore, any attempt to enhance the growth rate by increasing the high frequency power leads to an increase in the sheath potential which adversely affects oxide bulk and interface properties.

It would be advantageous if a low temperature process could form oxide layers with bulk and interface characteristics superior to oxide layers formed by low temperature methods such as PECVD.

It would be advantageous if a low temperature process could form oxide layers with bulk and interface characteristics approaching those for thermal oxide.

It would be advantageous if a low temperature process could deposit oxide at rates greater than those for low temperature methods such as PECVD.

SUMMARY OF THE INVENTION

The present invention describes an oxide interface, fabricated at temperatures below 400° C., having bulk and interface characteristics approaching those for thermal oxide. The present invention also describes a process that yields the above mentioned oxide interface. The present invention is accomplished using a high-density inductively coupled plasma source and chemical vapor deposition. The present invention allows the formation of integrated circuit (IC) devices, such as thin film transistors (TFTs), on transparent substrates, such as glass and polymer.

Accordingly, a method is provided for fabricating thin film oxides. The method comprises forming a silicon layer and an oxide layer overlying the silicon layer. The oxide layer is formed at a temperature of less than 400° C. using an inductively coupled plasma source. In some aspects of the method, the oxide layer is more than 20 nanometers (nm) thick and has a refractive index between approximately 1.45 and 1.47. In some aspects of the method, the oxide layer is formed by plasma oxidizing the silicon layer, producing plasma oxide at a rate of up to approximately 4.4 nm per minute (after one minute). The plasma oxide is formed by plasma oxidizing the silicon layer at specified parameters including power density, pressure, process gas composition, and process gas flow. In some aspects of the method, the silicon and oxide layers are incorporated into a TFT by forming a transparent substrate layer, overlying the substrate with a diffusion barrier, and overlying the diffusion barrier with the silicon layer. Then, transistor channel, source, and drain regions are formed in the silicon layer, the oxide layer forms a gate dielectric layer, and a gate electrode overlying the gate dielectric layer is formed. The gate dielectric layer has a fixed oxide charge density of less than $5 \times 10^{11}$ per square centimeter.

In some aspects of the method, a high-density plasma enhanced chemical vapor deposition (HD-PECVD) process is used to form the oxide layer. In some aspects of the method, the oxide layer is a bilayer with both plasma oxide and HD-PECVD oxide sub-layers.

Additional details of the above-described method, and an oxide interface are presented in detail below.

BRIEF DESCRIPTION OF THE DRAWINGS

FIG. 10 is a flowchart illustrating the present invention method for fabricating thin films.

FIG. 11 is a flowchart illustrating the present invention method for in-situ fabrication of thin films.

DETAILED DESCRIPTION OF THE PREFERRED EMBODIMENTS

Figure 1:
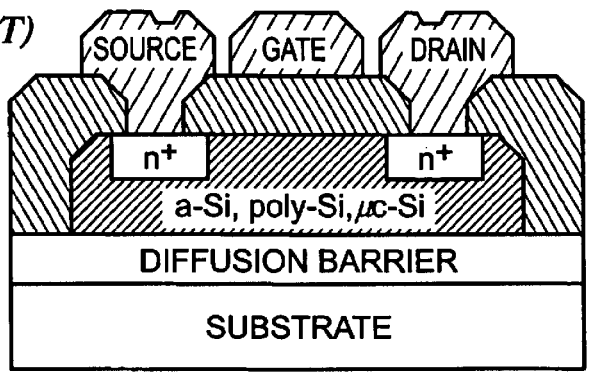
FIG. 1 is a schematic of a stacked gate structure for a thin film transistor (prior art).
Figure 2:
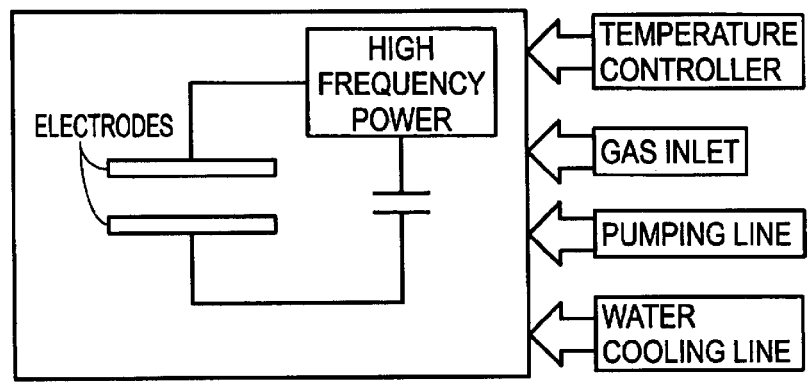
FIG. 2 is a schematic drawing of a plasma enhanced chemical vapor deposition (PECVD) system (prior art).
Figure 3:
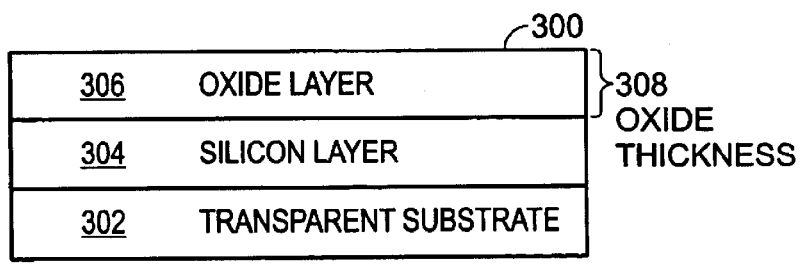
FIG. 3 is a partial cross-sectional view of the present invention oxide interface.

FIG. 3 is a partial cross-sectional view of the present invention oxide interface. A transparent substrate 302 is overlain with a silicon layer 304. An oxide layer 306, with a thickness 308, overlies the silicon layer 304. A high-density inductively coupled plasma (ICP) source (not shown) is used to form the oxide layer 306 at a temperature less than 400° C. The transparent substrate 302 can be glass or polymer, but is not limited to these materials. Forming the oxide layer 306 at a temperature less than 400° C. permits the use of the transparent substrate 302, which is incompatible with the temperatures associated with thermal oxidation (800° C. to 1200° C.). In turn, the transparent substrate 302 facilitates the use of the oxide interface 300 in display devices, such as devices with liquid crystal displays (LCDs). The silicon layer 304 can be selected from the group including amorphous silicon, microcrystalline silicon, and polycrystalline silicon.

The oxide layer 306 has bulk characteristics approaching those for thermal oxide. Bulk characteristics are inherent to the physical composition of the oxide layer 306, in comparison to interface characteristics that measure the electrical performance of the oxide layer 306, for example, in an IC device. In some aspects of the interface, the thickness 308 is more than 20 nanometers (nm). For a thickness 308 greater than 20 nm, the refractive index for the oxide layer 306 typically lies between approximately 1.45 and 1.47. As a comparison, thermal oxide has a refractive index of 1.46.

In some aspects of the interface, the oxide layer 306 is a plasma oxide. That is, the oxide layer 306 is formed by plasma oxidizing the silicon layer 304. For thickness 308 values less than 20 nm, plasma oxide has interface characteristics (as described below) comparable to thermal oxide, making plasma oxide particularly well suited for use in relatively thin layers.

Figure 4:
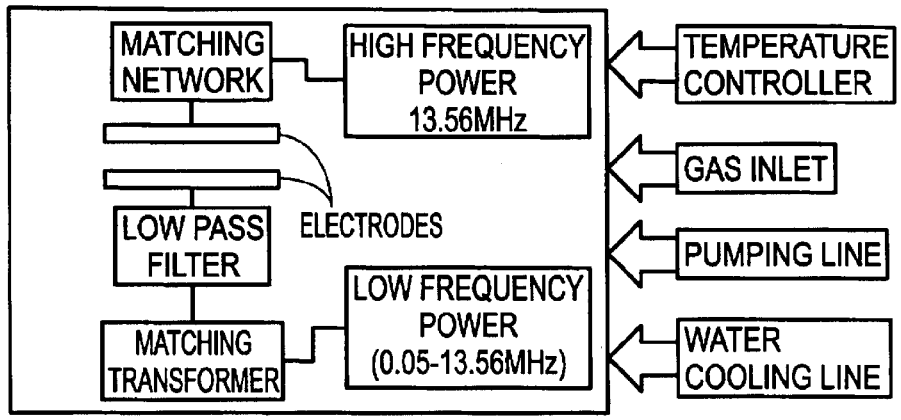
FIG. 4 is a schematic drawing of a high-density plasma enhanced chemical deposition (HD-PECVD) system.
Figure 5:
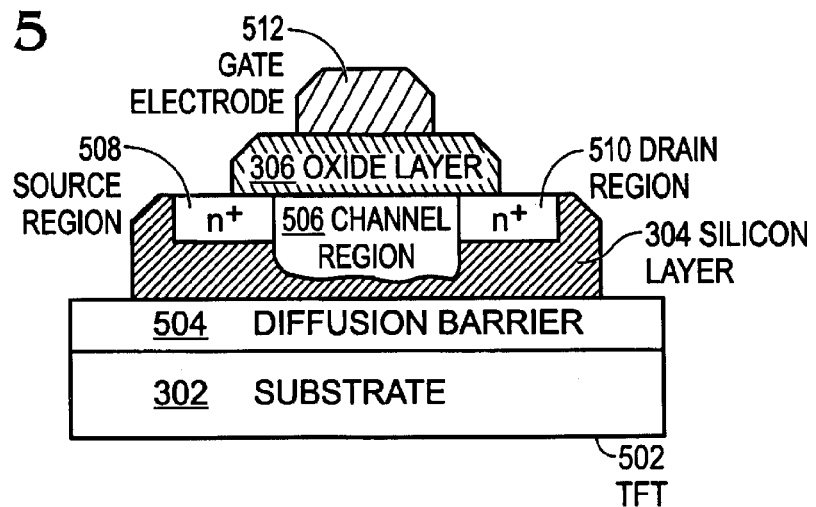
FIG. 5 is a partial cross-sectional view of the present invention thin film transistor (TFT).

FIG. 4 is a schematic drawing of a high-density plasma enhanced chemical vapor deposition (HD-PECVD) system. FIG. 5 is a partial cross-sectional view of the present invention thin film transistor (TFT). In some aspects of the invention, the oxide layer 306 is a deposition oxide formed by using the HD-PECVD process shown in FIG. 4. The higher plasma density and energy levels associated with the HD-PECVD process permit it to deposit oxides with fewer impurities than those for conventional PECVD processes performed at less than 400° C. In some aspects of the interface, the deposition oxide forming the oxide layer 306 has a thickness 308 up to 100 nm. However, the thickness 308 is not limited to 100 nm for deposition oxide. 100 nm is chosen to illustrate a typical thickness 308 for IC devices, for example, the TFT shown in FIG. 5, incorporating the oxide layer 306.

The oxide layer 306 includes silicon oxide and silicon oxynitride, but is not limited to these materials. For deposition oxides, the type of oxide forming oxide layer 306 is dependent on the precursor gases used in the HD-PECVD process. Silane, tertraethoxy silane, and other silicon-containing compounds are suitable precursors for silicon. Neon, argon, and helium can be used for the inert gas. Oxygen or $N_2O$ can be used for the oxidizing gas. To incorporate nitrogen and fluorine into the oxide layer 306, suitable precursors containing these elements can be used, such as, fluorocarbons and ammonia.

In some aspects, the oxide layer 306 is formed using a transmission/transformer coupled plasma (TCP) source (not shown). The use of a TCP source results in the same oxide layer 306 bulk and interface characteristics as those associated with the use of an ICP source. However, the TCP source allows the process to be scaled up for larger applications, such as LCDs.

Figure 6:
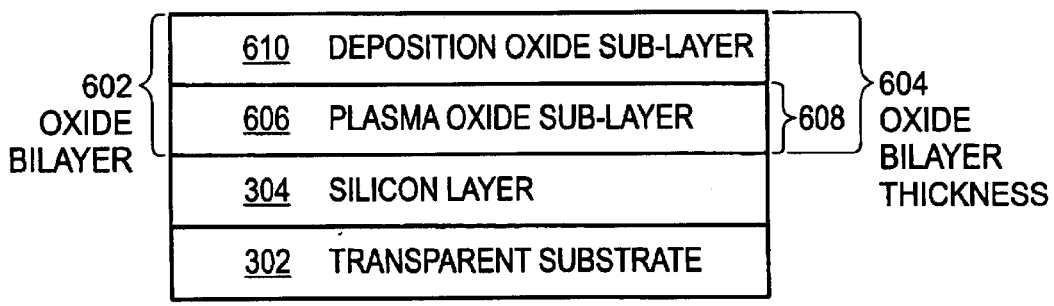
FIG. 6 is a partial cross-sectional view showing further details of FIG. 3.

FIG. 6 is a partial cross-sectional view showing further details of FIG. 3. Plasma oxide and deposition oxide each have advantages with respect to optimal layer thickness and rate of formation. In some aspects of the interface, an oxide bilayer 602 with a thickness 604 overlies the silicon layer 304. A sub-layer 606 of plasma oxide with a thickness 608 forms the first sub-layer of bilayer 602. A sub-layer 610 of deposition oxide overlies the sub-layer 606. Plasma oxide is used for the sub-layer 606 since plasma oxide has better interface characteristics than deposition oxide at thickness less than 20 nm. These interface characteristics are further described below. However, plasma oxide has a slower growth rate (approximately 4.4 nm/minute) than deposition oxide (greater than approximately 10 nm/minute). The plasma growth rate of 4.4 nm/minute is the growth rate established one minute after a plasma oxidation process begins. The deposition oxide growth rate of greater than 10 nm/minute is the growth rate established 10 minutes after a HD-PECVD process begins. Therefore, it is preferred to limit the thickness 608 to less than 20 nm. Deposition oxide with its higher growth rate and good bulk and interface characteristics at thickness above 10 nm is used for the sub-layer 610 to attain the desired thickness 604. In some aspects of the invention, the thickness 604 ranges from 10 to 100 nm. However, the thickness 604 is not limited to 100 nm. 100 nm is chosen to illustrate a typical thickness 604 for IC devices, for example, the TFT in FIG. 5, incorporating the oxide bilayer 602.

It should be understood that the TFT of FIG. 5 is offered only as one illustration of the invention. In the TFT 502, a diffusion barrier 504 overlies the substrate 302 and underlies the silicon layer 304. The silicon layer 304 includes a channel region 506, a source region 508, and a drain region 510. A gate electrode 512 overlies the oxide layer 306. The oxide layer 306 acts as a gate insulator.

The interface or electrical characteristics of the oxide layer 306 can be measured within the structure of the TFT 502. In the TFT 502, the oxide layer 306 has the following interface characteristics: a fixed oxide charge density less than $5 \times 10^{11}/cm^2$; an interface trap concentration of approximately $0.9 \times 10^{10}$ to $8 \times 10^{10}$ per square centimeter—electron volt ($/cm^2$ eV); a flat band voltage shift of less than 1 V under a 30 minute bias temperature stress reliability test at 150° C. and ±2 megavolts per centimeter (MV/cm); a leakage current density lower than $10^{-7}$ amperes per square centimeter ($A/cm^2$) at an applied electric field of 8 Mv/cm;

and, a breakdown field strength greater than 10 Mv/cm. For deposition oxide, the interface trap concentration is approximately $2\times10^{10}$ to $8\times10^{10}/cm^2$ eV. These interface characteristics approach those for thermal oxide. For example, the flat-band voltage shift, leakage current density, and breakdown field strength are approximately of the same order for thermal oxide, plasma oxide, and deposition oxide (at thicknesses greater than approximately 10 nm).

Functional Description

The present invention oxide interface and method combine the use of a high-density inductively coupled plasma (HD-ICP) source and a high-density plasma enhanced chemical vapor deposition (HD-PECVD) process, both operating at substrate temperatures below 400° C. The present invention oxide interface and method produce high quality oxide layers at growth rates significantly higher than those for conventional thermal oxides. The present invention method is an in-situ process forming gate oxide layers for thin film transistors (TFTs) and other integrated circuit (IC) applications. Processing below 400° C. (hereafter referred to as low temperature) permits the possibility of integration on transparent substrates such as glass and polymer. The present invention uses the HD-PECVD system configuration shown in FIG. 4. The use of the HD-PECVD system configuration allows the electrodes in FIG. 4 to be decoupled, resulting in low self-bias at the substrate. Thus, the HD-PECVD system configuration permits independent control of plasma ion/electron density and energy to enhance both film growth rate and bulk and interface properties.

The oxides formed by this process have better bulk and interface characteristics and fewer impurities. The HD-PECVD system configuration is used for both the plasma oxidation of silicon and the HD-PECVD deposition of $SiO_2$ thin films.

As noted in the Background Section, thermal oxidation produces an oxide with good bulk and interface characteristics. However, thermal $SiO_2$ growth rates are impractical at temperatures below 800° C. The present invention high-density plasma oxidation of silicon has shown growth rates significantly higher than those for thermal oxidation. In addition, plasma oxide maintains good characteristics in thin layers (less than 20 nm).

The HD-PECVD process is effective in minimizing impurities incorporated in the films during deposition at low processing temperatures, as well as, impurity related bonds in the films. This is possible because plasma density and energy levels are higher for the HD-PECVD process than those for conventional PECVD processes.

The invention also combines plasma oxide and HD-PECVD oxide into an oxide bilayer as shown in FIG. 6. One application for the oxide bilayer is a low temperature high quality gate oxide stack for TFT devices as shown in FIG. 5. The interface and bulk properties of the gate oxide layer can be significantly enhanced by fabricating stacked structures using a combination of plasma oxidation of the silicon and HD-PECVD techniques. The plasma oxidation of silicon at temperatures below 400° C. using the HD-ICP source makes it possible to enhance the gate interface characteristics while exploiting the high deposition rate of the HD-PECVD process. That is, the invention takes advantage of the properties associated with plasma oxide and HD-PECVD oxide by first forming a thin plasma oxide layer and then depositing a (generally) thicker HD-PECVD oxide layer. Since the oxidation rate for plasma oxide is relatively low, it is preferred to minimize the thickness of the plasma oxide as necessary to obtain the desirable interface properties. This is typically less than 20 nm. HD-PECVD oxide, with its higher growth rate, is then deposited over the plasma oxide layer. The gate stacked structures fabricated in-situ by using a combination of the plasma oxidation and HD-PECVD processes at substrate temperatures below 400° C. provide significant enhancement in gate oxide quality, compared to those processed by conventional PECVD processes currently being used for TFT and other IC applications. These gate stacked structures also can solve major issues related to integration on low temperature substrates, interface quality, and reliability of gate structures. In addition, for IC device manufacturing, the present invention can significantly reduce the thermal budget and increase device throughput.

Figure 7:
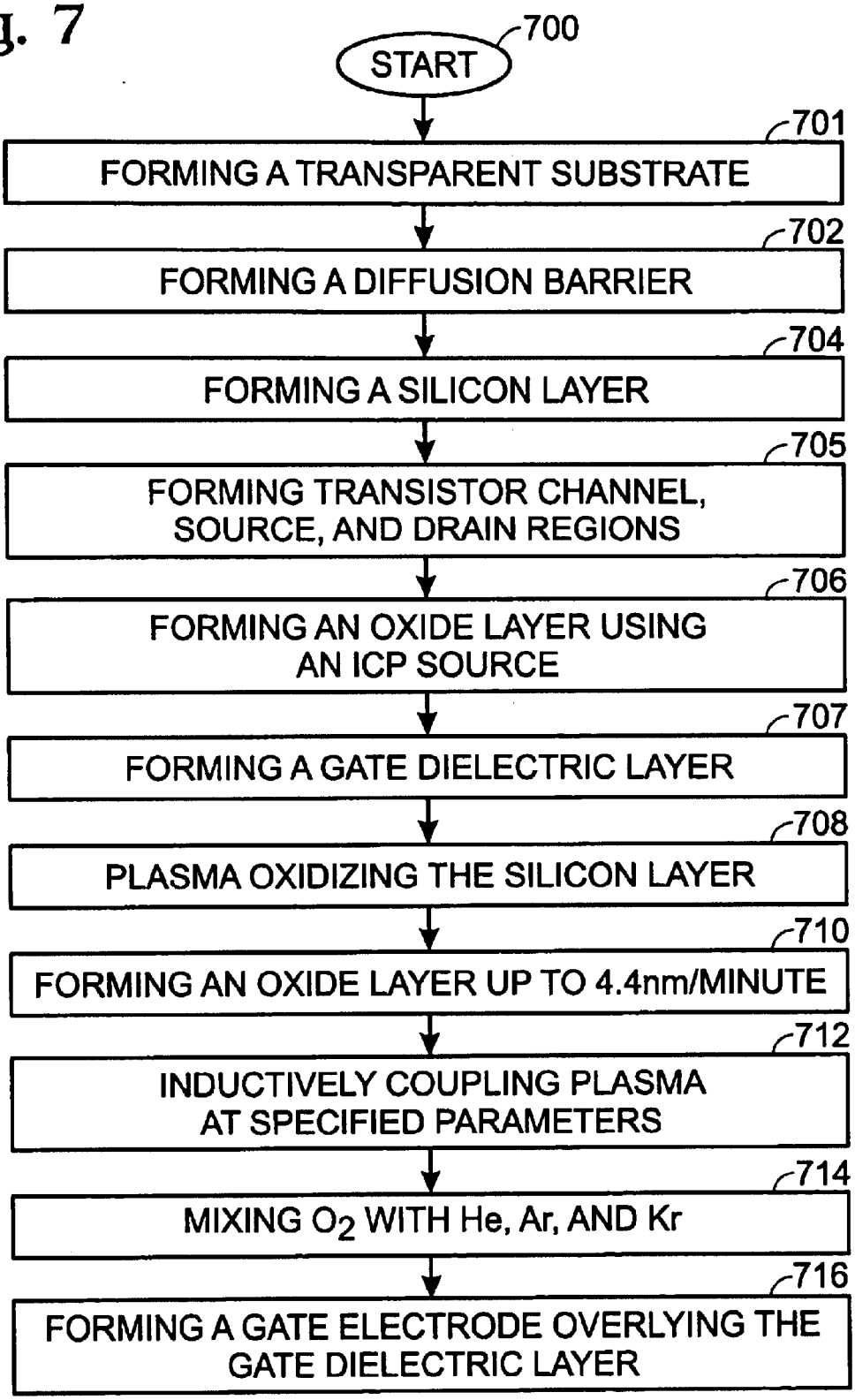
FIG. 7 is a flowchart illustrating the present invention method for fabricating thin films.

FIG. 7 is a flowchart illustrating the present invention method for fabricating thin films. Although the method in FIG. 7 (and FIGS. 8, 9, 10, and 11 below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700. Step 704 forms a silicon layer. Step 706 forms an oxide layer overlying the silicon layer at a temperature of less than 400° C. using an inductively coupled plasma source. Step 708 plasma oxidizes the silicon layer. Step 710 forms oxide at a rate of up to approximately 4.4 nm per minute (after one minute). Step 712 inductively couples plasma: at approximately 13.56 megahertz (MHz) with a power density of approximately 0.1 to 1.6 watts per square centimeter ($W/cm^2$); at a pressure of approximately 15 to 500 milliTorr (mTorr); with a mixture of rare gas and oxygen in a ratio of approximately 20:1 to 200:1; and, with a total gas flow of approximately 50 to 200 standard cubic centimeters per minute (sccm). Step 714 mixes oxygen with rare gas selected from the group including helium, argon, and krypton.

The following describes one possible sequence for forming a TFT using the present invention method. It is understood that other sequences also are possible for FIG. 7. In some aspects of the method, Step 701 forms a transparent substrate layer. Then, Step 702 forms a diffusion barrier overlying the substrate layer and underlying the silicon layer. In some aspects of the method, Step 705, following the forming of a silicon layer in Step 704, forms transistor channel, source, and drain regions in the silicon layer. In some aspects of the method, Step 707, following the forming of an oxide layer overlying the silicon layer in Step 706, forms a gate dielectric layer with: a fixed oxide charge density of less than $5\times10^{11}$ per square centimeter ($/cm^2$); an interface trap concentration of approximately $0.9\times10^{10}$ to $8\times10^{10}$ per square centimeter–electron volt ($/cm^2$ eV); a flat band voltage shift of less than 1 V under a 30 minute bias temperature stress reliability test at 150° C. and ±2 megavolts per centimeter (MV/cm); a leakage current density lower than $10^{-7}$ amperes per square centimeter ($A/cm^2$) at an applied electric field of 8 Mv/cm; and, a breakdown field strength greater than 10 MV/cm. Then, Step 716 forms a gate electrode overlying the gate dielectric layer.

In some aspects of the method, forming an oxide layer overlying the silicon layer in Step 706 includes forming the oxide layer more than 20 nanometers (nm) thick and forming the oxide layer with a refractive index between approximately 1.45 and 1.47. In some aspects of the method, plasma oxidizing the silicon layer in Step 708 includes forming an oxide layer less than 20 nm thick.

Figure 8:
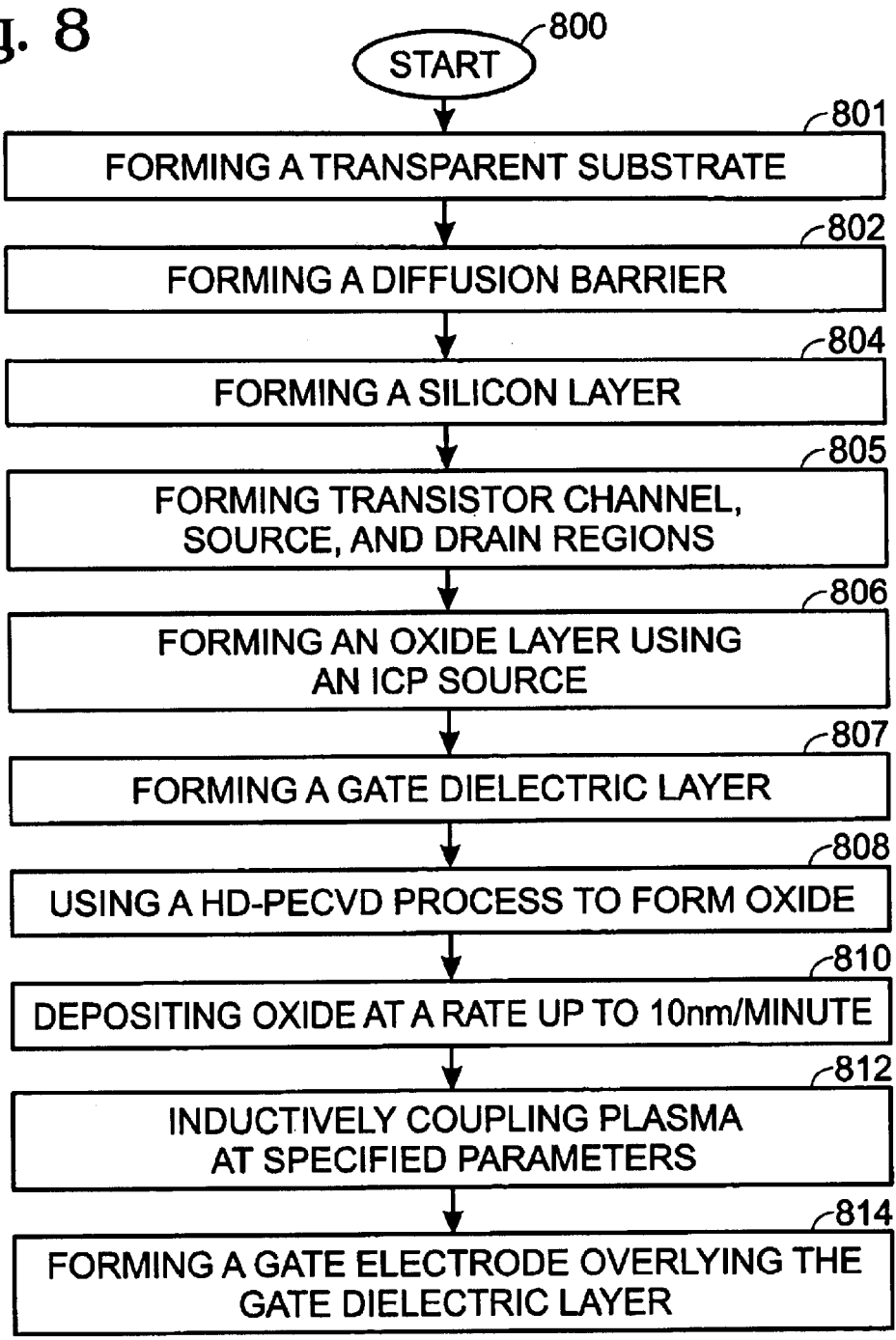
FIG. 8 is a flowchart illustrating additional details of the method shown in FIG. 7.

FIG. 8 is a flowchart further illustrating the method shown in FIG. 7. The method starts at Step 800. Step 804 forms a silicon layer. Step 806 forms an oxide layer overlying the silicon layer at a temperature of less than 400° C. using an inductively coupled plasma source. Step 808 uses a high-density plasma enhanced chemical vapor deposition (HD-PECVD) process to form the oxide layer. Step 810 deposits oxide at a rate of greater than approximately 10 nm per minute (after 10 minutes). Step 812 inductively couples plasma: at approximately 380° C.; at approximately 13.56 MHz with a power density of approximately 0.2 to 1.6 W/cm$^2$; at a pressure of approximately 50 to 250 mTorr; and, with a mixture of SiH$_4$, N$_2$O and N$_2$ gases in a ratio of approximately 10:100:50 to 25:100:50.

The following describes one possible sequence for forming a TFT using the present invention method. It is understood that other sequences also are possible for FIG. 8. In some aspects of the method, Step 801 forms a transparent substrate layer. Then, Step 802 forms a diffusion barrier overlying the substrate layer and underlying the silicon layer. In some aspects of the method, Step 805, following the forming of a silicon layer in Step 804, forms transistor channel, source, and drain regions in the silicon layer. In some aspects of the method, Step 807, following the forming of an oxide layer overlying the silicon layer in Step 806, forms a gate dielectric layer with: a fixed oxide charge density of less than 5×10$^{11}$/cm$^2$; an interface trap concentration of approximately 2×10$^{10}$ to 8×10$^{10}$/cm$^2$ eV; a flat band voltage shift of less than 1 V under a 30 minute bias temperature stress reliability test at 150° C. and ±2 Mv/cm; a leakage current density lower than 10$^{-7}$ A/cm$^2$ at an applied electric field of 8 Mv/cm; and, a breakdown field strength greater than 10 Mv/cm. Then, Step 814 forms a gate electrode overlying the gate dielectric layer.

In some aspects of the method, using a HD-PECVD process to form the oxide layer in Step 808 includes forming an oxide layer between approximately 10 and 100 nm thick.

Figure 9:
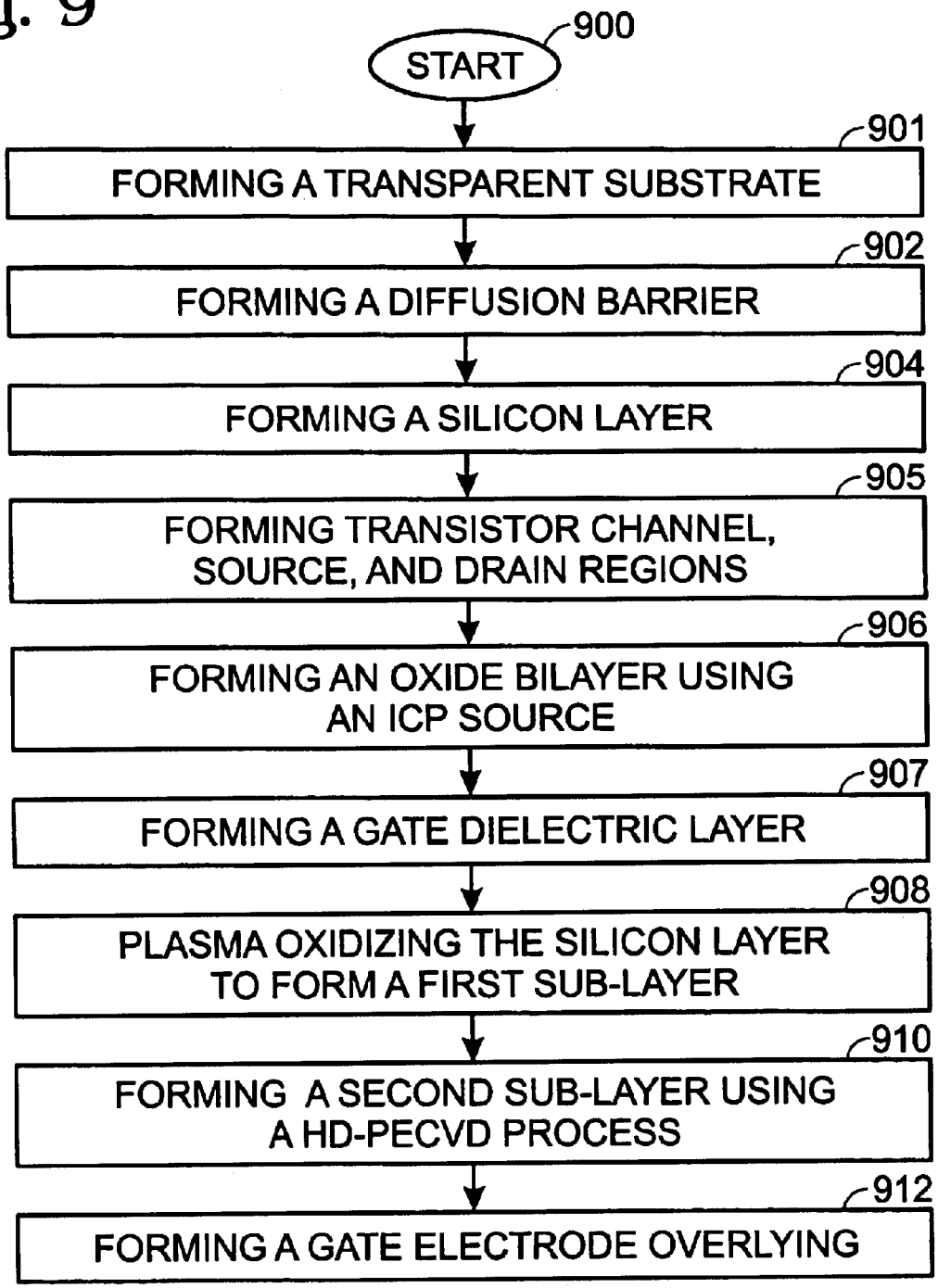
FIG. 9 is a flowchart illustrating additional details of the method shown in FIG. 7.

FIG. 9 is a flowchart further illustrating the method shown in FIG. 7. The method starts with Step 900. Step 904 forms a silicon layer. Step 906 forms an oxide bilayer overlying the silicon layer at a temperature of less than 400° C. using an inductively coupled plasma source. Step 908 plasma oxidizes the underlying silicon layer to form a first oxide layer. Step 910 forms a second oxide layer overlying the first oxide layer using a HD-PECVD process.

The following describes one possible sequence for forming a TFT using the present invention method. It is understood that other sequences also are possible for FIG. 9. In some aspects of the method, Step 901 forms a transparent substrate layer. Then, Step 902 forms a diffusion barrier overlying the substrate layer and underlying the silicon layer. In some aspects of the method, Step 905, following the forming of a silicon layer in Step 904, forms transistor channel, source, and drain regions in the silicon layer. In some aspects of the method, Step 907, following the forming of an oxide bilayer overlying the silicon layer in Step 906, forms a gate dielectric layer. Then, Step 912 forms a gate electrode overlying the gate dielectric layer.

In some aspects of the method, forming an oxide bilayer in Step 906 includes forming a bilayer approximately 10 to 100 nm thick.

FIG. 10 is a flowchart illustrating the present invention method for fabricating thin films. The method starts with Step 1000. Step 1002 forms a silicon layer. Step 1004 forms an oxide layer overlying the silicon layer at a temperature of less than 400° C. using a transformer coupled plasma source.

In some aspects of the method, forming an oxide layer overlying the silicon layer in Step 1004 includes forming the oxide layer more than 20 nm thick and forming the oxide layer with a refractive index between approximately 1.45 and 1.47.

FIG. 11 is a flowchart illustrating the present invention method for in-situ fabrication of thin films. The method starts at Step 1100. Step 1102 forms a silicon layer in a first film processing chamber. Step 1104 leaves the formed silicon layer in the first film processing chamber and forms an oxide layer overlying the silicon layer at a temperature of less than 400° C. using an inductively coupled plasma source. Leaving the formed silicon layer in the first chamber (Step 1104) means that the step in performed in-situ with the previous step, Step 1102.

An oxide interface formed overlying a transparent substrate has been provided. A method to fabricate the above-mention oxide interface also has been provided. However, use of the present invention is not limited to transparent substrates. The present invention can be used on any substrate compatible with temperatures of approximately 400° C. In addition, the present invention can be used to form oxide layers in other applications, such as forming a diffusion barrier for a TFT or other IC device.

The invention has been shown using plasma oxidation and HD-PECVD. However, radical oxidation and atomic layer deposition (ALD) also can be used in the invention. The radical oxidation process involves the use of a radiation source of suitable wavelength (less than 200 nm) to create reactive oxygen species for oxidation. The radical oxidation process can be carried out in combination with the HD-PECVD process in the same chamber. Gate stack structures can be fabricated by first oxidizing the silicon surface by the radical oxidation process and then depositing a HD-PECVD oxide layer overlying the oxidized silicon surface. The same stack structure also can be formed by first oxidizing the silicon surface using atomic layer deposition and then depositing a HD-PECVD oxide layer overlying the oxidized silicon surface.

Examples have been provided of some material thicknesses and of some configurations, such as a TFT. Likewise, some process specifics have been given to clearly explain the fundamental concepts. However, the present invention is not limited to just those thickness, configurations, and specifics. Other variations and embodiments of the present invention will occur to those skilled in the art.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. A method for fabricating thin film oxides, the method comprising:

forming a silicon layer; and, plasma oxidizing the silicon layer to form an oxide layer overlying the silicon layer at a temperature of less than 400° C., using an inductively coupled plasma source.

2. The method of claim 1 wherein plasma oxidizing the silicon layer includes:

forming the oxide layer more than 20 nanometers (nm) thick; and, forming the oxide layer with a refractive index between approximately 1.45 and 1.47.

3. The method of claim 1 wherein plasma oxidizing the silicon layer includes forming oxide at a rate of up to approximately 4.4 nm per minute.

4. The method of claim 3 wherein plasma oxidizing the silicon layer includes forming an oxide layer less than 20 nm thick.

5. The method of claim 3 wherein plasma oxidizing the silicon layer includes inductively coupling plasma:
   at approximately 13.56 megahertz (MHz) with a power density of approximately 0.1 to 1.6 watts per square centimeter (W/cm$^2$);
   at a pressure of approximately 15 to 500 milliTorr (mTorr);
   with a mixture of rare gas and oxygen in a ratio of approximately 20:1 to 200:1; and,
   with a total gas flow of approximately 50 to 200 standard cubic centimeters per minute (sccm).

6. The method of claim 5 wherein inductively coupling plasma with a mixture of rare gas and oxygen includes mixing oxygen with rare gas selected from the group including helium, argon, and krypton.

7. The method of claim 6 further comprising:
   forming a transparent substrate layer;
   forming a diffusion barrier overlying the substrate layer and underlying the silicon layer;
   wherein forming the silicon layer includes forming transistor channel, source, and drain regions in the silicon layer;
   wherein plasma oxidizing the silicon layer includes forming a gate dielectric layer; and,
   the method further comprising:
   forming a gate electrode overlying the gate dielectric layer.

8. The method of claim 7 wherein forming a gate dielectric layer includes forming a layer with:
   a fixed oxide charge density of less than $5\times10^{11}$ per square centimeter (/cm$^2$);
   an interface trap concentration of approximately $0.9\times10^{10}$ to $8\times10^{10}$ per square centimeter—electron volt (/cm$^2$ eV);
   a flat band voltage shift of less than 1 V under a 30 minute bias temperature stress reliability test at 150° C. and ±2 megavolts per centimeter (MV/cm);
   a leakage current density lower than $10^{-7}$ amperes per square centimeter (A/cm$^2$) at an applied electric field of 8 MV/cm; and,
   a breakdown field strength greater than 10 MV/cm.

9. The method of claim 1 wherein forming a silicon layer includes forming a layer selected from the group including amorphous silicon, microcrystalline silicon, and polycrystalline silicon.

10. The method of claim 1 wherein plasma oxidizing includes forming an oxide selected from the group including silicon oxide and silicon oxynitride.

11. A method for fabricating thin film oxides, the method comprising:
    forming a silicon layer; and,
    depositing an oxide layer overlying the silicon layer at a temperature of less than 400° C. and at a rate of greater than approximately 10 nm per minute using a high-density plasma enhanced chemical vapor deposition (HD-PECVD) process with an inductively coupled plasma source.

12. The method of claim 11 wherein depositing the oxide layer includes forming an oxide layer between approximately 10 and 100 nm thick.

13. The method of claim 11 wherein depositing the oxide layer includes inductively coupling plasma:
    at approximately 380° C.;
    at approximately 13.56 MHz with a power density of approximately 0.2 to 1.6 W/cm$^2$;
    at a pressure of approximately 50 to 250 mTorr; and,
    with a mixture of SiH$_0$, N$_2$O, and N$_2$ gases in a ratio of approximately 10:100:50 to 25:100:50.

14. The method of claim 13 further comprising:
    forming a transparent substrate layer;
    forming a diffusion barrier overlying the substrate layer and underlying the silicon layer;
    wherein forming the silicon layer includes forming transistor channel, source, and drain regions in the silicon layer;
    wherein depositing the oxide layer includes forming a gate dielectric layer; and,
    the method further comprising:
    forming a gate electrode overlying the gate dielectric layer.

15. The method of claim 14 wherein depositing the oxide layer includes forming a layer with:
    a fixed oxide charge density of less than $5\times10^{11}$/cm$^2$;
    an interface trap concentration of approximately $2\times10^{10}$ to $8\times10^{10}$ /cm$^2$ eV;
    a flat band voltage shift of lees than 1 V under a 30 minute bias temperature stress reliability test at 150° C. and ±2 MV/cm;
    a leakage current density lower than $10^{-7}$ A/cm$^2$ at an applied electric field of 8 MV/cm; and,
    a breakdown field strength greater than 10 MV/cm.

16. The method of claim 11 wherein forming the silicon layer includes forming a layer selected from the group including amorphous silicon, microcrystalline silicon, and polycrystalline silicon.

17. The method of claim 11 wherein depositing the oxide layer includes forming an oxide selected from the group including silicon oxide and silicon oxynitride.

18. A method for fabricating thin film oxides, the method comprising:
    forming a silicon layer; and,
    forming an oxide bilayer overlying the silicon layer at a temperature of less than 400° C. using an inductively coupled plasma source.

19. The method of claim 18 wherein forming the oxide bilayer includes:
    plasma oxidizing the underlying silicon layer to form a first oxide layer; and,
    depositing a second oxide layer overlying the first oxide layer using a HD-PECVD process.

20. The method of claim 19 wherein forming an oxide bilayer includes forming a bilayer approximately 10 to 100 nm thick.

21. The method of claim 19 further comprising:
    forming a transparent substrate layer;
    forming a diffusion barrier overlying the substrate layer and underlying the silicon layer;
    wherein forming the silicon layer includes forming transistor channel, source, and drain regions in the silicon layer;
    wherein forming the oxide bilayer includes forming a gate dielectric layer; and,
    the method further comprising:

forming a gate electrode overlying the gate dielectric layer.

22. The method of claim 18 wherein forming the silicon layer includes forming a layer selected from the group including amorphous silicon, microcrystalline silicon, and polycrystalline silicon.

23. The method of claim 18 wherein forming the oxide bilayer includes forming an oxide bilayer selected from the group including silicon oxide and silicon oxynitride.

24. A method for the in-situ fabrication of thin film oxides, the method comprising:
   in a first film processing chamber, forming a silicon layer; and,
   leaving the formed silicon layer in the first film processing chamber, plasma oxidizing the silicon layer at a temperature of less than 400° C. using an inductively coupled plasma source.

25. A method for fabricating thin film oxides, the method comprising:
   forming a silicon layer including a transistor channel region;
   depositing oxide layer at a temperature of less than 400° C. using a high-density plasma enhanced chemical vapor deposition (HD)-PECVD) process, by inductively coupling plasma at 13.56 MHz with a power density in the range of 0.2 to 1.6 W/cm$^2$; and,
   forming a transistor gate oxide layer overlying the silicon layer.

26. A method for fabricating thin film oxides, the method comprising:
   forming a silicon layer;
   forming an oxide bilayer at a temperature of less than 400° C., and using an inductively coupled plasma source, as follows:
   plasma oxidizing the silicon layer; and,
   subsequently depositing oxide overlying the oxidized silicon using a high density plasma-enhanced chemical vapor deposition (HD-PECVD) process.

27. A method for the in-situ fabrication of thin film oxides, the method comprising:
   in a first film processing chamber, forming a silicon layer; and,
   leaving the formed silicon layer in the first film processing chamber, depositing oxide on the silicon layer at a temperature of less than 400° C., using inductively coupled plasms at 13.56 MHz with a power density in the range of 0.2 to 1.6 W/cm$^2$.

28. A method for the in-situ fabrication of thin film oxides, the method comprising:
   in a first film processing chamber, forming a silicon layer; and,
   leaving the formed silicon layer in the first film processing chamber, forming an oxide bilayer on the silicon layer at a temperature of less than 400° C. using an inductively coupled plasma source.

* * * * *